(12) United States Patent
Petenyi

(10) Patent No.: US 10,289,140 B2
(45) Date of Patent: May 14, 2019

(54) VOLTAGE REGULATOR HAVING BIAS CURRENT BOOSTING

(71) Applicant: STMICROELECTRONICS DESIGN AND APPLICATION S.R.O., Prague (CZ)

(72) Inventor: Sandor Petenyi, Milovice Nad Labem (CZ)

(73) Assignee: STMicroelectronics Design and Application S.R.O., Prague (CZ)

(*) Notice: Subject to any disclaimer, the term of this patent is extended or adjusted under 35 U.S.C. 154(b) by 0 days.

(21) Appl. No.: 15/336,029

(22) Filed: Oct. 27, 2016

(65) Prior Publication Data

US 2018/0120876 A1 May 3, 2018

(51) Int. Cl.
*G05F 1/575* (2006.01)
*H03F 3/45* (2006.01)

(52) U.S. Cl.
CPC ......... *G05F 1/575* (2013.01); *H03F 3/45071* (2013.01); *H03F 2203/45116* (2013.01); *H03F 2203/45154* (2013.01); *H03F 2203/45274* (2013.01)

(58) Field of Classification Search
CPC .. G05F 1/46; G05F 1/462; G05F 1/56; H03K 5/24; H03K 5/2481; H03F 2203/45116; H03F 2203/45154; H03F 2203/45274; H03F 2203/21127; H03F 3/45071
See application file for complete search history.

(56) References Cited

U.S. PATENT DOCUMENTS

| | | | | |
|---|---|---|---|---|
| 6,690,147 B2* | 2/2004 | Bonto | ..................... | G05F 1/575 323/273 |
| 8,289,009 B1* | 10/2012 | Strik | ....................... | G05F 1/575 323/272 |
| 2007/0252646 A1* | 11/2007 | Leung | ................... | H03F 1/0266 330/136 |
| 2009/0212753 A1* | 8/2009 | Lou | ......................... | G05F 1/563 323/277 |
| 2013/0113447 A1* | 5/2013 | Kadanka | ................... | G05F 1/56 323/280 |
| 2017/0205840 A1* | 7/2017 | Ogura | ....................... | G05F 1/46 |

FOREIGN PATENT DOCUMENTS

JP  2004-240646  *  8/2004

* cited by examiner

*Primary Examiner* — Jue Zhang
*Assistant Examiner* — Jye-June Lee
(74) *Attorney, Agent, or Firm* — Seed IP Law Group LLP

(57) ABSTRACT

A voltage regulator having bias current boosting is provided. The voltage regulator includes a power stage for providing an output voltage to a load. The voltage regulator includes a differential stage that receives a feedback voltage representative of the output voltage and a reference voltage and controls the power stage based on a difference between the reference voltage and the feedback voltage. The voltage regulator includes a bias current boosting stage that receives the feedback and reference voltages. The bias current boosting stage provides a boosted bias current having a current level that is based on the difference between the reference and feedback voltages. The boosted bias current biases the differential stage and hastens a response of the differential stage, in response to a change in the difference between the reference voltage and the feedback voltage, in controlling the power stage.

14 Claims, 6 Drawing Sheets

VOLTAGE REGULATOR HAVING BIAS CURRENT BOOSTING

BACKGROUND

Technical Field

This application is directed to a voltage regulator, and, in particular, a voltage regulator that includes a stage for boosting a bias current of an error amplifier.

Description of the Related Art

Voltage regulators utilize a feedback loop to provide a regulated output voltage using an unregulated input voltage. The feedback loop attempts to retain the output voltage at a voltage level of a desired output voltage. In response to connecting a load to the regulator output the output voltage drops and the output current increases. In conventional regulators, the recovery of the output voltage level to the desired output voltage level lags in time and negatively impacts the performance of the regulator.

It is desirable to have a voltage regulator that expeditiously responds to drops and changes in the output voltage.

BRIEF SUMMARY

In an embodiment, a voltage regulator includes a power stage having an input, and an output for providing an output voltage to a load. The voltage regulator includes a differential stage having a first input for receiving a feedback voltage representative of the output voltage, a second input for receiving a reference voltage, and an output coupled to the input of the power stage. The differential stage is configured to control the power stage based on a difference between the reference voltage and the feedback voltage. The voltage regulator includes a bias current boosting stage having a first input for receiving the feedback voltage, a second input for receiving the reference voltage, and an output coupled to the bias current input of the differential stage. The bias current boosting stage is configured to provide a boosted bias current, having a current level that is based on the difference between the reference voltage and the feedback voltage, and bias the differential stage based on the boosted bias current. The bias current boosting stage or the boosted bias current are operable to hasten a response of the differential stage, in response to a change in the difference between the reference voltage and the feedback voltage, in controlling the power stage.

In an embodiment, a voltage regulator includes a power stage having an input, and an output for providing an output voltage. The voltage regulator includes a differential amplifier having a first input for receiving a feedback voltage representative of the output voltage, a second input for receiving a reference voltage, a bias current input, and an output coupled to the input of the power stage. The differential amplifier is configured to output an error voltage to control the power stage. The voltage regulator includes a voltage-controlled current source having a first input for receiving a first voltage representative of the feedback voltage, a second input for receiving the reference voltage, and an output coupled to the bias current input of the differential amplifier. The voltage-controlled current source is configured to output a boosted bias current, based on a difference between the reference voltage and the first voltage, and bias the differential amplifier based on the boosted bias current.

A method includes receiving a reference voltage and a first voltage representative of an output voltage of a voltage regulator and producing a boosted bias current based at least in part on a difference between the reference voltage and the first voltage. The method includes biasing a differential amplifier with the boosted bias current to shorten a response time of the differential amplifier in response to changes to the output voltage during load transient conditions.

DETAILED DESCRIPTION

Figure 1:
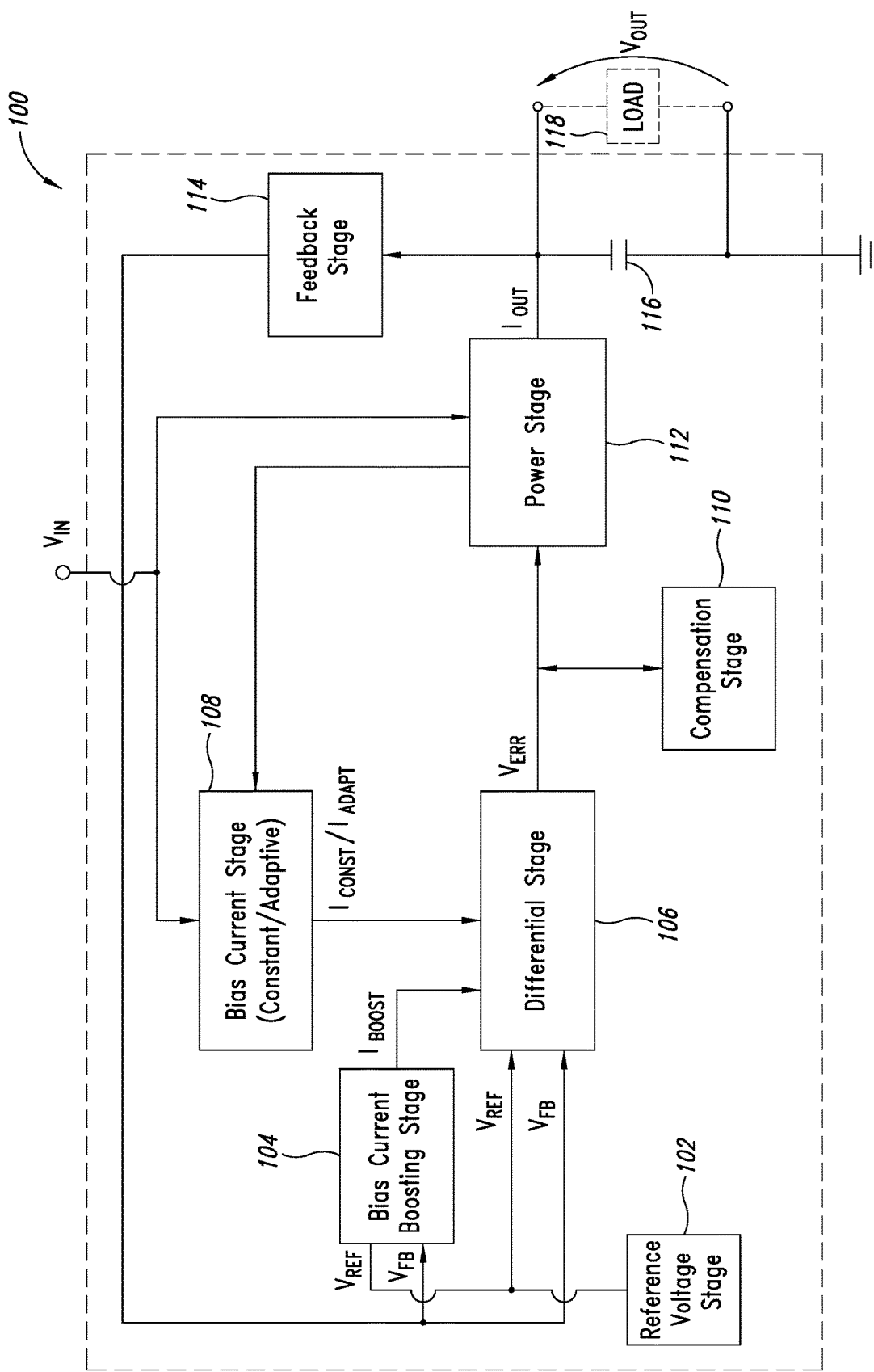
FIG. 1 shows a block diagram of a regulator having bias current boosting.

FIG. 1 shows a block diagram of a regulator 100 having bias current boosting. The regulator 100 includes a reference voltage stage 102, a bias current boosting stage 104, a differential stage 106, a bias current stage 108, a compensation stage 110, a power stage 112, a feedback stage 114 and an output capacitance 116. The regulator 100 receives an input voltage ($V_{IN}$) and provides an output voltage ($V_{OUT}$) to a load 118. The input voltage may be a variable unregulated voltage. The regulator 100 provides an output voltage that is regulated in relation to the input voltage.

The differential stage 106 receives a feedback voltage ($V_{FB}$) provided by the feedback stage 114 and a reference voltage ($V_{REF}$) provided by the reference voltage stage 102. The differential stage 106 outputs an error voltage ($V_{ERR}$) representing a difference between the feedback voltage and the reference voltage. The power stage 112 receives the error voltage and the input voltage. The power stage 112 provides an output voltage that minimizes the error voltage. The output voltage is used to drive the load 118.

The differential stage 106 receives at least one of a constant bias current ($I_{CONST}$) and an adaptive bias current ($I_{ADAPT}$) from the bias current stage 108. The constant bias current may remain at a constant level during the operation of the regulator 100 irrespective of load conditions. The adaptive bias current may change as a function of the load 118, the output voltage provided to the load 118 or the output current ($I_{OUT}$) provided by the power stage 112. The bias current stage 112 detects the output current of the regulator 100 and provides the adaptive bias current based on the output current.

The differential stage 106 also receives a boosted bias current ($I_{BOOST}$) from the bias current boosting stage 104. Similar to the differential stage 106, the bias current boosting stage 104 receives the feedback voltage from the feedback stage 114 and the reference voltage from the reference voltage stage 102. The bias current boosting stage 104 provides the boosted bias current based on a difference between the reference voltage and the feedback voltage.

Providing the boosted bias current to the differential stage 106 improves the response of the differential stage 106. For example, during load transient conditions the load 118 increases in a short span of time. As a result, the load current of the regulator 100 increases and the output voltage decreases. The boosted bias current improves the slew rate of the differential stage 106 under those conditions and consequently hastens the response of the differential stage 106 (and the regulator 100) to changes in the feedback voltage during a load transient condition. When the output voltage recovers, the feedback voltage nears or matches the reference voltage. Consequently, the bias current boosting stage 104 ceases providing the boosted bias current to the differential stage 106.

From a power consumption perspective, the bias current boosting stage 104 efficiently boosts the bias current during transient conditions when the regulator 100 can utilize the bias current. The bias current boosting stage 104 removes and ceases proving the boosted bias current when a transient condition end and a steady-state condition is reached.

Figure 2:
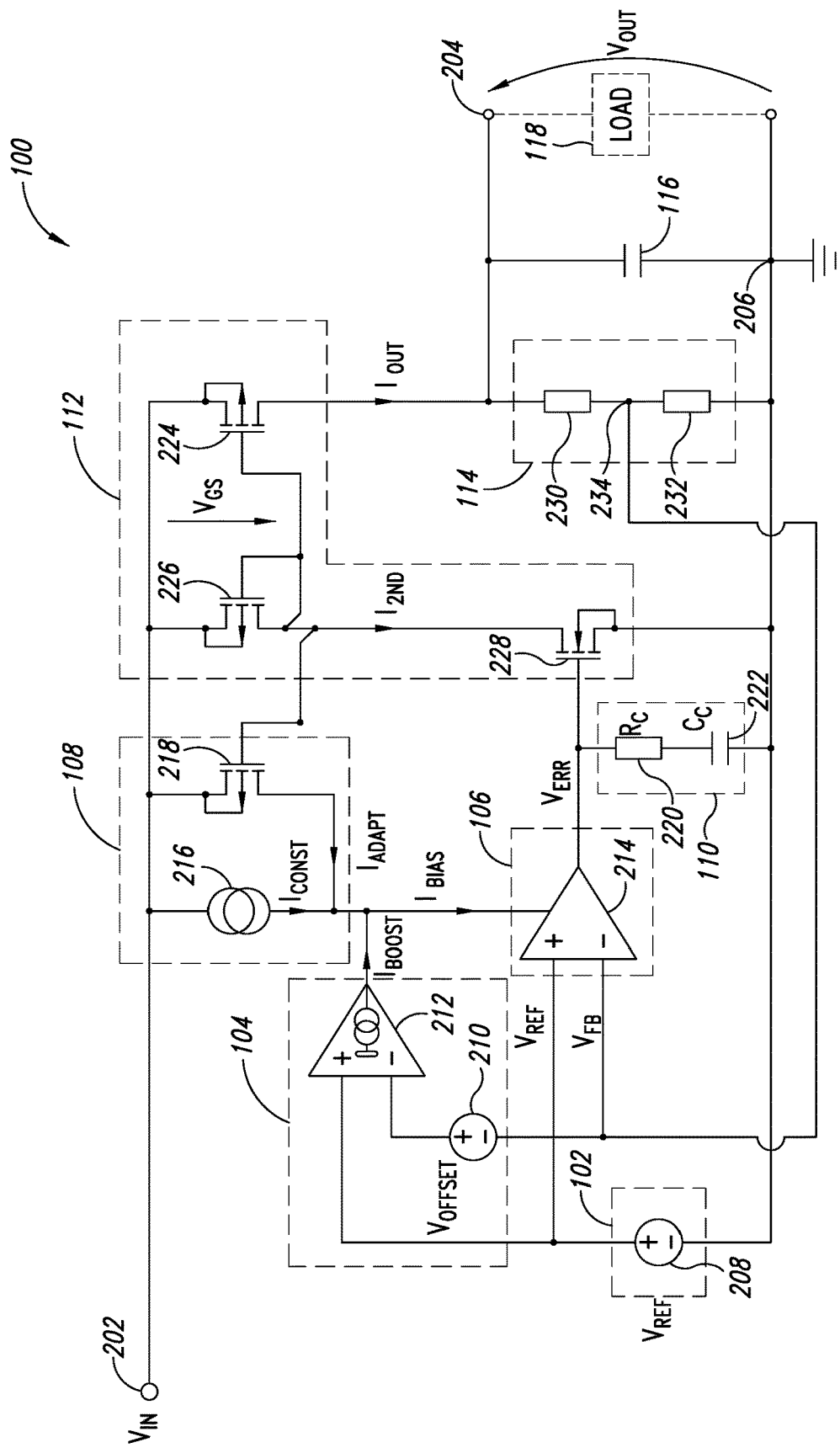
FIG. 2 shows a schematic of the regulator having bias current boosting in accordance with an embodiment.

FIG. 2 shows a schematic of the regulator 100 having bias current boosting in accordance with an embodiment. Elements of the regulator 100 similar to those of the regulator 100 described with reference to FIG. 1 have the same reference numerals. The regulator 100 is coupled between an input voltage node 202, an output voltage node 204 and a ground node 206.

The reference voltage stage 102 includes a reference voltage source 208. The bias current boosting stage 104 includes an offset voltage source 210 and an operational transconductance amplifier 212. The differential stage 106 includes a differential amplifier 214. The bias current stage 108 includes a current source 216 and a current mirror transistor 218. The compensation stage 110 includes a compensation resistance 220 and a compensation capacitance 222. The power stage 112 includes a power transistor 224, a diode-connected transistor 226 and a level shifting transistor 228. The feedback stage 114 includes a first feedback resistance 230 and a second feedback resistance 232.

The first feedback resistance 230 is coupled between the output voltage node 204 and a voltage divider node 234. The second feedback resistance 232 is coupled between the voltage divider node 234 and the ground node 206. The reference voltage source 208 has an anode coupled to the ground node 206 and a cathode.

The differential amplifier 214 has an inverting input coupled to the voltage divider node 234 and a noninverting input coupled to the cathode of the reference voltage source 208. The differential amplifier 214 also has a bias current input and an output.

The offset voltage source 210 has an anode coupled to the voltage divider node 234 and a cathode. The operational transconductance amplifier 212 has an inverting input coupled to the cathode of the offset voltage source 210 and a noninverting input coupled to the cathode of the reference voltage source 208. The operational transconductance amplifier 212 has an output coupled to the bias current input of the differential amplifier 214.

The compensation resistance 220 and the compensation capacitance 222 are coupled in series to each other and between the output of the differential amplifier 214 and the ground node 206.

The level shifting transistor 228 has a gate coupled to the output of the differential amplifier 214, a source coupled to the ground node 206 and a drain. The power transistor 224 has a source coupled to the input voltage node 202, a drain coupled to the output voltage node 204 and a gate coupled to the drain of the level shifting transistor 228. The diode-connected transistor 226 has a source coupled to the input voltage node 202 and a drain and a gate coupled to each other and to the gate of the power transistor 224.

The current mirror transistor 218 has a source coupled to the input voltage node 202, a drain coupled to the bias current input of the differential amplifier 214 and a gate coupled to the drain of the diode-connected transistor 226. The current source 216 has an anode coupled to the input voltage node 202 and a cathode coupled to the bias current input of the differential amplifier 214.

The differential amplifier 214 receives, at its noninverting input, the reference voltage from the reference voltage source 208 and receives, at its inverting input, the feedback voltage. The feedback voltage is a proportion of the output voltage as divided by a voltage divider formed by the first and second feedback resistances 230, 232. The differential amplifier 214 outputs the error voltage representing the difference between the reference voltage and the feedback voltage.

In some alternative embodiments, the feedback stage 114 is not used. In these embodiments, the reference voltage source 208 generates a reference voltage that is the same as the desired output voltage of the regulator 100 and, absent the feedback stage 114, the feedback voltage is the same as the output voltage. It is noted that use of the feedback stage 114 is advantageous in that, due to scaling the output voltage, the voltage level of the regulator-generated reference voltage is reduced thus resulting in reducing the power consumption of the regulator 100.

The error voltage is used to drive the level shifting transistor 228. The error voltage controls the voltage of the gate of the level shifting transistor 228. In addition, the compensation stage 110 compensates the frequency characteristic of the regulation loop for maintaining its stability. The compensation capacitance 222 introduces a pole and the compensation resistor 220 introduces a zero in a transfer function. As the load current changes the voltage at the gate of level shifting transistor 228 changes, accordingly, resulting in drain current ($I_{2nd}$) variation controlling the $V_{GS}$ of the power transistor 224. The compensation capacitor 222 stores a charge which is delivered or removed with the load changes. The bias current ($I_{BIAS}$) of the differential stage 106 is a source that is able to deliver the charge to the compensation capacitor 222. Thus, to increase the $I_{OUT}$ level, the level of the bias current ($I_{BIAS}$) is boosted, which results in increasing the voltage across the compensation capacitance 222.

The voltage of the gate of the level shifting transistor 228 controls the current passing through the drain ($I_D$) of the level shifting transistor 228. Because the drain of the level shifting transistor 228 is electrically coupled to the gate of the power transistor 224, controlling the gate of the level shifting transistor 228 also controls the power transistor 224. The power transistor 224 provides an output current of the regulator 100 that is dependent on the drain current. Because the power transistor 228 and the diode-connected transistor 226 are in a current mirror configuration the drain current has a linear relationship with the output current. The linear relationship is determined based on the relative sizes of the diode-connected transistor 226 and the power transistor 228. For example, if the size of the power transistor 228 is 1000 times the size of the diode-connected transistor 226, the gate current will be relatively small in relation to the output current. A size mismatch of this magnitude or similar magnitudes ensures a relatively low quiescent current of the regulator 100.

Because the current mirror transistor 218 and the diode-connected transistor 226 are in a current mirror configuration, the adaptive bias current provided to the differential amplifier 214 is a function of the drain current and the relative sizes of the current mirror transistor 218 and the diode-connected transistor 226. When the regulator 100 is not connected to the load 118 the adaptive bias current will be zero amperes (A) because the output current is 0 A. As the output current increases the adaptive bias current also increases.

The constant bias current provided to the differential amplifier 214 by the current source 216 may remain constant or substantially constant at various operating conditions of the regulator 100. The constant bias current may have a relatively low current level, such as 100 nanoamperes (nA). The relatively low current level of the constant bias current allows for efficiently operating the regulator 100 and ensures a relatively low power consumption of the regulator 100.

In addition to the adaptive bias current and the constant bias current, the differential amplifier 214 is biased by the boosted bias current provided by the operational transconductance amplifier 212. It is noted that although the operational transconductance amplifier 212 is described herein, a different voltage-controlled current source may be utilized.

The operational transconductance amplifier 212 receives the reference voltage provided by the reference voltage source 208 and receives the feedback voltage shifted by an offset voltage. The offset voltage is provided by the offset voltage source 210 and may have a moderate voltage level, such as 10 millivolts (mV). The offset voltage is provided to ensure that the current boosting is only triggered if the feedback voltage drops below the reference voltage by an amount greater than the offset voltage.

The operational transconductance amplifier 212 compares the sum of the feedback voltage and the offset voltage to the reference voltage. Comparing the sum of the feedback voltage and the offset voltage to the reference voltage is tantamount to comparing the error voltage to the offset voltage. When the error voltage is greater than the offset voltage, the operational transconductance amplifier 212 outputs a boosted bias current that is a function of the difference between the error voltage and the offset voltage. The boosted bias current is provided to the differential amplifier 214. The boosted bias current improves operation of the differential amplifier 214 during load transient conditions.

In steady-state conditions, the error voltage (the difference between the reference voltage and the feedback voltage) is less than the offset voltage and, accordingly, the boosted bias current is not provided. During load transient conditions, the load 118 may be connected to the regulator 100. In a relatively short span of time the output voltage of the regulator may drop below the desired output voltage. Further, the feedback voltage drops by an amount greater than the offset voltage. The operational transconductance amplifier 212 detects the drop in the feedback voltage and provides the boosted bias current to the operational amplifier 214.

The boosted bias current improves the reaction time of the operational amplifier 214 during the load transient condition. The boosted bias current provides additional current to the differential amplifier 214. Consequently, differential amplifier 214 more expeditiously drives the level shifting transistor 228 to increase the output voltage. Furthermore, the boosted bias current charges the compensation capacitance 222. The boosted bias current improves the response time of the regulator 100. As a result, the output voltage recovers more quickly.

Figure 3:
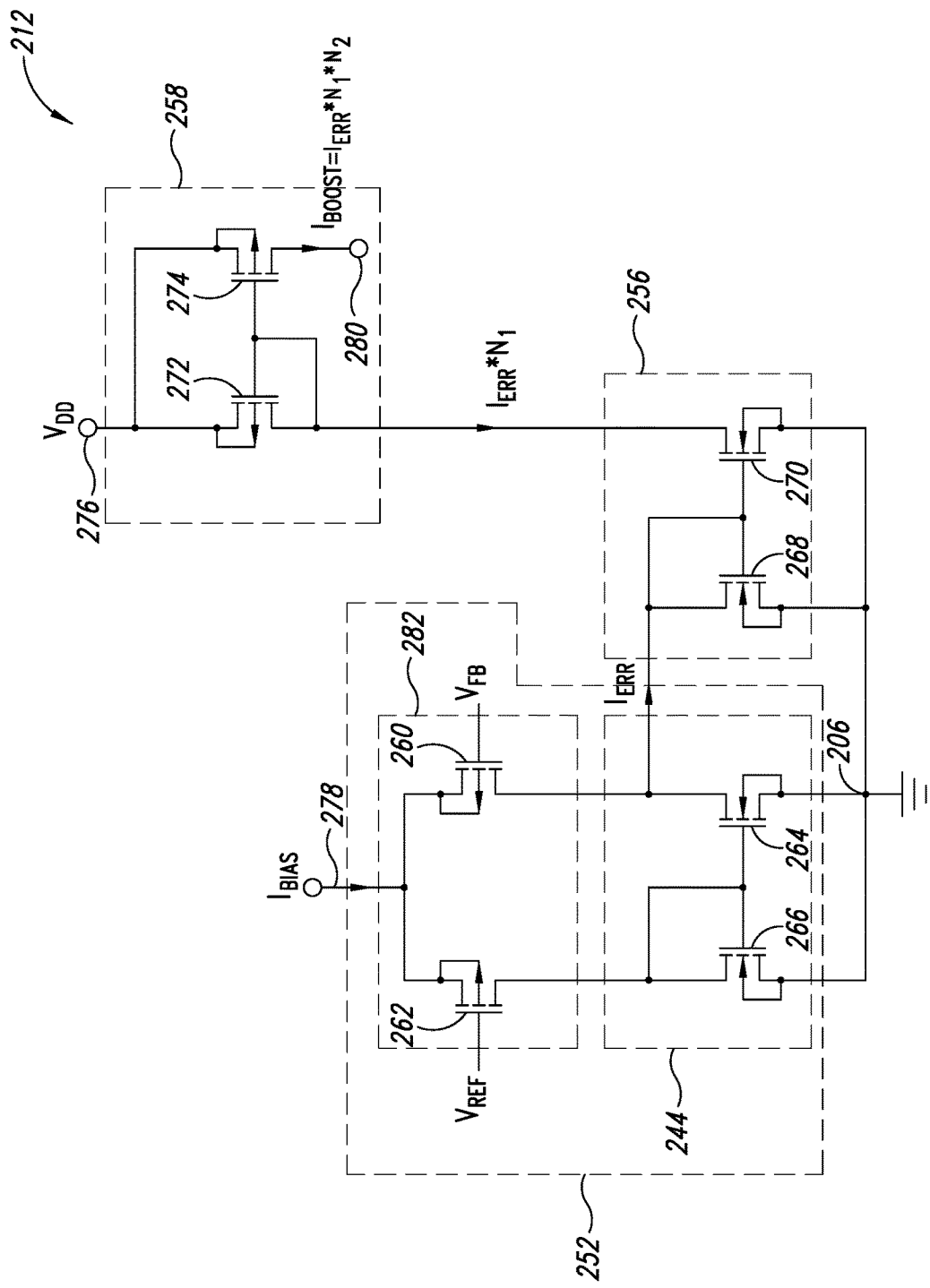
FIG. 3 shows a schematic of the operational transconductance amplifier in accordance with an embodiment.

FIG. 3 shows a schematic of the operational transconductance amplifier 212 in accordance with an embodiment. The operational transconductance amplifier 212 includes a differential input stage 252, a first current mirror stage 256 and the second current mirror stage 258. The differential input stage 252 includes a differential input pair 282 an active load 244. The differential input pair 282 has a first input for receiving the feedback voltage (having an offset voltage applied thereto) and a second input for receiving the reference voltage. The differential input pair 282 has a bias current input for receiving the bias current of the operational transconductance amplifier 212. The differential input pair 282 has an output coupled to an input of the active load 244. An output of the active load 244 is coupled to an input of the first current mirror stage 256. An output of the first current mirror stage 256 is coupled to an input of the second current mirror stage 258. The second current mirror stage provides the boosted bias current of the operational transconductance amplifier 212.

The differential input pair 282 includes a first differential input transistor 260 and a second differential input transistor 262. The active load 244 includes a first output transistor 264 and a second output transistor 266. The first current mirror stage 256 includes a first current mirror transistor 268 and a second current mirror transistor 270. The second current mirror stage 258 includes a third current mirror transistor 272 and a second current mirror transistor 274. The operational transconductance amplifier 212 is coupled between a voltage source node 276, a bias current input node 278, the ground node 206 and a boosted bias current output node 280.

The first differential input transistor 260 has a source coupled to the bias current input node 278 and a gate for receiving the feedback voltage. The first differential input transistor 260 also has a drain. The second differential input transistor 262 has a source coupled to the bias current input node 278 and a gate for receiving the reference voltage. The second differential input transistor 262 also has a drain. A voltage offset may be embedded into the differential input pair 282 by configuring the sizes of the first and second differential input transistors 260, 262 to be unequal. In particular the channel width of the second differential input transistor 262 receiving the reference voltage may be larger than that of the first differential input transistor 260. The length of the differential input transistors 260, 262, however, may be the same.

The first output transistor 264 has a drain coupled to the drain of the first differential input transistor 260, a source coupled to the ground node 206 and a gate coupled to the drain of the second differential input transistor 262. The second output transistor 266 has a drain coupled to the drain of the second differential input transistor 262, a source coupled to the ground node 206 and a gate coupled to both the gate of the first output transistor 264 and the drain of the second differential input transistor 262.

The first current mirror transistor 268 has a drain and a gate that are both coupled to the drain of the first output transistor 264. The first current mirror transistor 268 has a source coupled to the ground node 206. The second current mirror transistor 270 has a gate coupled to both the drain and gate of the first current mirror transistor 268. The second current mirror transistor 270 has a source coupled to the ground node 206 and a drain.

The third current mirror transistor 272 has a source coupled to the voltage source node 276 and a drain and a gate that are coupled to each other and to the drain of the second current mirror transistor 270. The fourth current mirror transistor 274 has a source coupled to the voltage source node 276, a gate coupled to the gate of the third current mirror transistor 272 and a drain coupled to the boosted bias current output node 280.

The feedback voltage and the reference voltage control the first and second differential input transistors 260, 262, respectively. Because the drain of the first differential input transistor 260 is connected to the drain of the first output transistor 264, the output of the differential input transistor 260 may be obtained at its drain. The output of the first differential input transistor 260 is loaded with the first current mirror transistor 268. An error current ($I_{ERR}$) is provided to the first current mirror transistor 268. The current level of the error current is based on the error voltage.

The first and second current mirror transistors 268, 270 are in a current mirror configuration. The current passing through the drain of the second current mirror transistor 270 is a function of the error current and the relative size of the second current mirror transistor 270 to the first current mirror transistor 268. The current passing through the drain of the second current mirror transistor 270 may be represented as $I_{ERR}N_1$, where $N_1$ is the ratio of the size of the second current mirror transistor 270 to the size of the first current mirror transistor 268.

In a steady state condition, when $V_{FB}$ is the same as $V_{REF}$, $I_{ERR}$ is 0 A. However, in an implementation, there may be a natural mismatch in the differential input stage 252. As a result of the mismatch, $I_{ERR}$ may be non-zero in a steady state condition. This may result in a significant current ($I_{BOOST}$) at the output of the transconductance amplifier 212.

To prevent current generation (for example, in a situation where there is a high degree of mismatch) an offset is defined in the differential input pair 282. The offset may be introduced by sizing the devices of the differential input pair 282 to be uneven. The channel width of the second differential input transistor 262 may be sized to be larger than the channel width of the first differential input transistor 260. The sizing defines a voltage offset. For example, the first and second differential input transistors 260, 262 may be sized such that a voltage offset of 10 mV is introduced. The offset voltage may result in the current (IBOOST) being 0 A in a steady state condition and accounts for a random or unintended mismatch in the manufacturing of implementation of the devices of the differential input stage 252.

Similarly, the boosted bias current provided at the drain of the fourth current mirror transistor 274 is a function of the current passing through the drain of the third current mirror transistor 272 and the relative sizes of the third and fourth current mirror transistors 272, 274. In particular, the boosted bias current may be represented as:

$$I_{BOOST} = I_{ERR}N_1N_2, \quad \text{Equation (1)}$$

where $N_2$ is the ratio between the size of the fourth current mirror transistor 274 and the third current mirror transistor 272.

The error current is dependent on the error voltage, the offset voltage and the transconductance of the first and second differential input transistors 260, 262. The error current may be represented as:

$$I_{ERR} = (V_{ERR} - V_{OFFSET})(g_1 + g_2). \quad \text{Equation (2)}$$

where $g_1$ is the transconductance of the first differential input transistor 260 and $g_2$ is the transconductance of the second differential input transistor 262. Based on Equations (1) and (2), the boosted bias current may be represented as:

$$I_{BOOST} = (V_{ERR} - V_{OFFSET})(g_1 + g_2)N_1N_2 \quad \text{Equation (3)}$$

Figure 4:
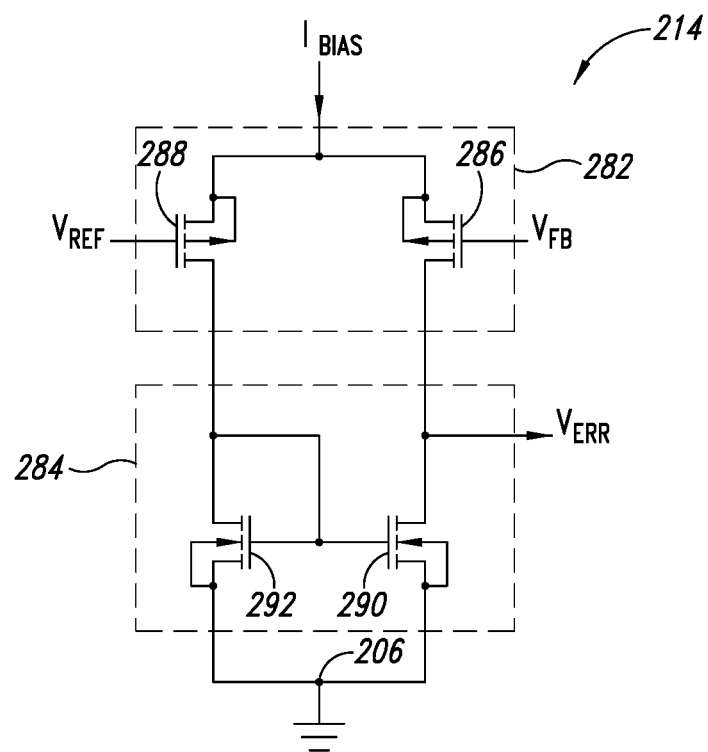
FIG. 4 shows a schematic of the differential amplifier in accordance with an embodiment.

FIG. 4 shows a schematic of the differential amplifier 214 in accordance with an embodiment. The differential amplifier 214 includes a differential input pair 282 and an active load 284. The differential input pair 282 has a first input for receiving the feedback voltage and a second input for receiving the reference voltage. The differential input pair 282 has a bias input for receiving the bias current of the differential amplifier 214. The differential input pair 282 is coupled, at an output, to an input of the active load 284. An output of the active load 284 provides the error voltage.

The differential input pair 282 includes a first differential input transistor 286 and a second differential input transistor 288. The active load 284 includes a first output transistor 290 and a second output transistor 292. The first differential input transistor 286 has a source for receiving the bias current, a gate for receiving the feedback voltage and a drain. The second differential input transistor 288 has a source for receiving the bias current, a gate for receiving the reference voltage and a drain.

The first output transistor 290 has a gate, a drain coupled to the drain of the first differential input transistor 286, and a source coupled to the ground node 206. The second output transistor 292 has a drain coupled to the drain of the second differential input transistor 288 and a source coupled to the ground node 206. The second output transistor 292 has a gate coupled to both its drain and the gate of the first output transistors 290.

The feedback voltage controls the first differential input transistor 286 and the reference voltage controls the second differential input transistor 288. The output voltage of the differential amplifier (the error voltage) may be obtained at the drain of the first differential input transistors 286.

Figure 5A:
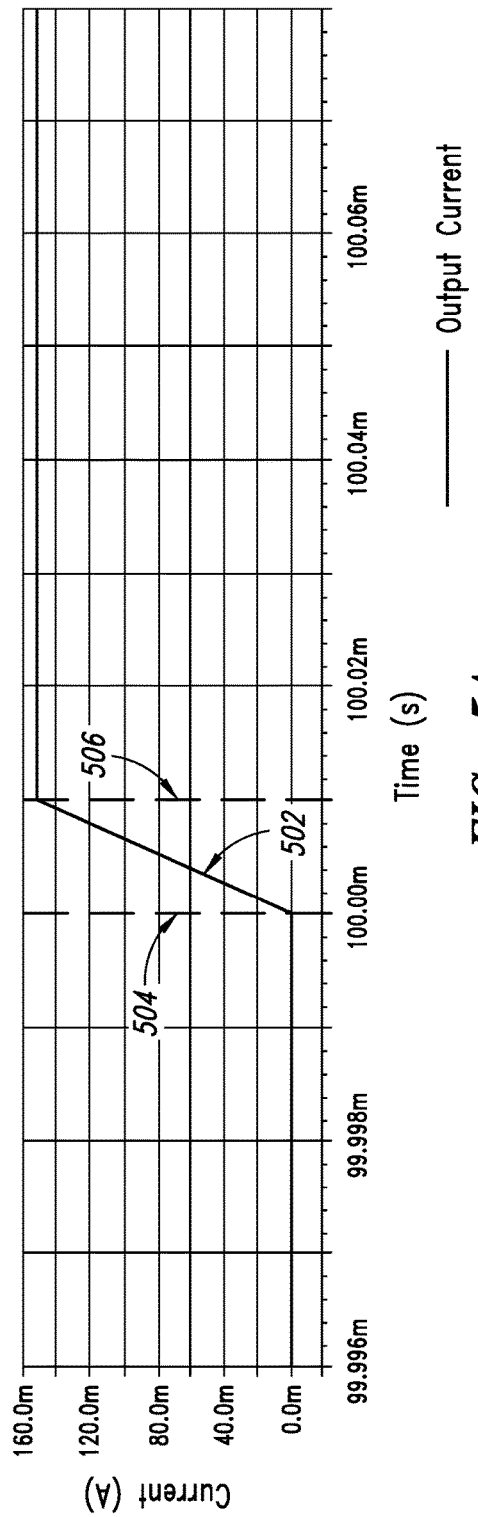
FIGS. 5A-D show a comparison between the performance of the regulator having bias current boosting and a conventional regulator.

FIGS. 5A-D show a comparison between the performance of the regulator 100 and a conventional regulator. The conventional regulator does not include a bias current boosting stage. As shown in FIG. 5A, initially the output currents (line 502) of both regulators increase. The increase occurs between a first time instant 504 and a second time instant 506. The output currents are shown to increase from 0 A to 160 milliampere (mA) in a period of 1 microsecond (μs). The increase in the output currents may be due to the fact that a load was connected to the regulators.

Figure 5B:
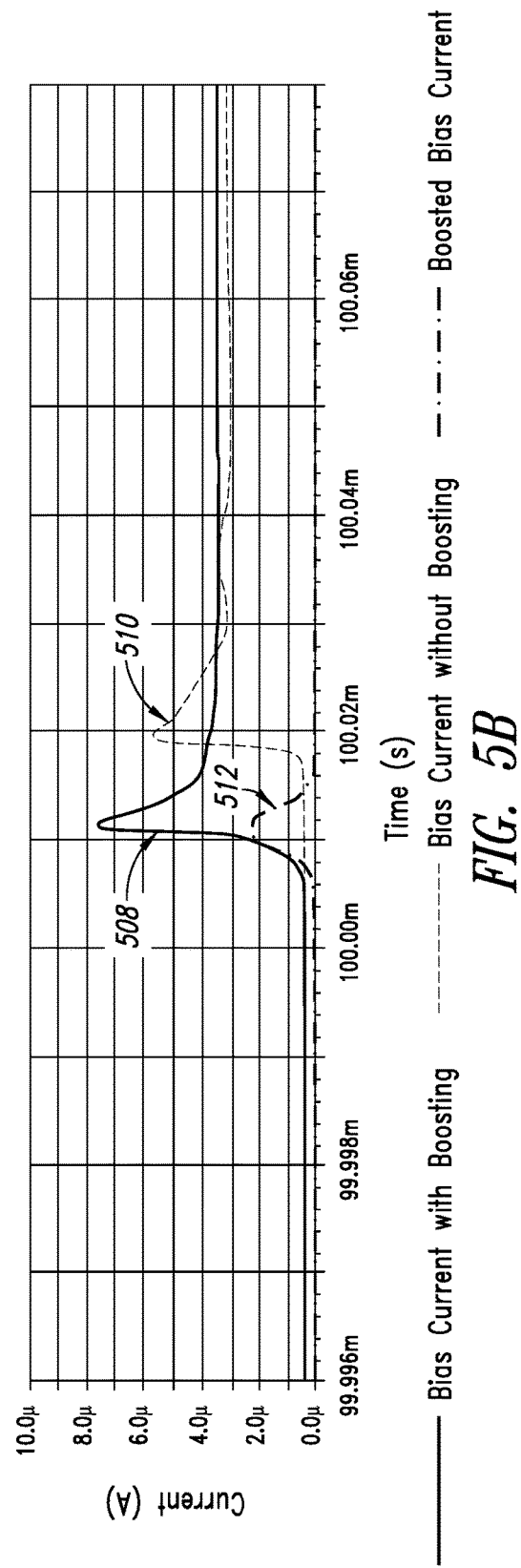

In response, the bias currents of the regulators increase. As shown in FIG. 5B, the bias current of the regulator 100 (line 508) increases about 1 μs faster than the bias current of the conventional regulator (line 510). Further, due to the addition of the boosted bias current (line 512), the bias current of the regulator 100 (line 508) reaches a greater maximum current level than the bias current of the conventional regulator (line 510). The boosted bias current hastens the response of the regulator 100 to an output current increase or the addition of a load and expedites the recovery of the output voltage.

After the transient condition ends (for example, after a third time instant 514), the bias currents of the regulator 100 and the conventional regulators are comparable. Removal of the boosted bias current after the end of the transient condition aids in improving the power efficiency of the regulator 100.

Figure 5C:
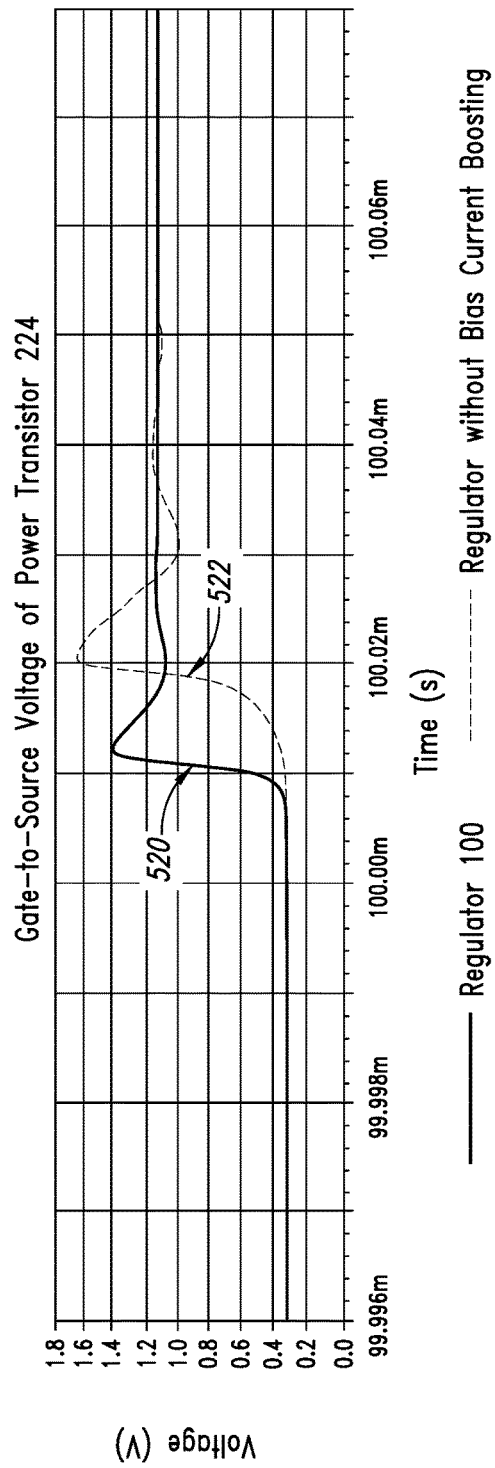
Figure 5D:
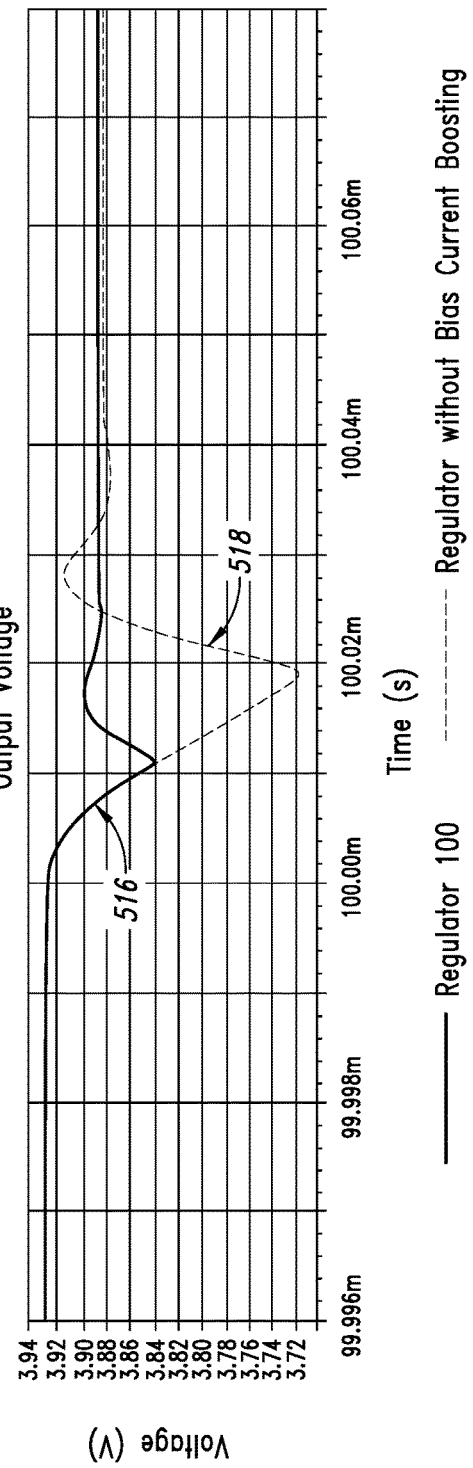

As shown in FIG. 5D, due to the boosted current provided to the regulator, the output voltage of the regulator 100 (line 516) does not droop to the extent to which the output voltage of the conventional regulator (line 518) does. Furthermore, the output voltage of the regulator 100 (line 516) recovers faster to a desired output voltage level than the conventional regulator (line 518). In addition, the gate-to-source voltage of the power transistor 224 of the regulator 100 increases more expeditiously than the gate-to-source voltage of a power transistor of the conventional regulator as shown in FIG. 5C.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage regulator, comprising:
a power stage having an input, and an output for providing an output voltage to a load;
a differential stage having a first input for receiving a feedback voltage representative of the output voltage, a second input for receiving a reference voltage, an output coupled to the input of the power stage, and a bias current input for receiving a boosted bias current, the differential stage being configured to control the power stage based on a difference between the reference voltage and the feedback voltage; and
a bias current boosting stage including:
an offset voltage source having an input for receiving the feedback voltage and an output for providing an offset-compensated feedback voltage by applying a voltage offset to the feedback voltage, and
a voltage-controlled current source having a first input for receiving the offset-compensated feedback voltage, and a second input for receiving the reference voltage, the voltage-controlled current source being operative to:
when the reference voltage is greater than the offset-compensated feedback voltage, output, over an output coupled to the bias current input of the differential stage, the boosted bias current, having a current level that is proportional to a difference between the reference voltage and the offset-compensated feedback voltage and bias the differential stage based on the boosted bias current to hasten a response of the differential stage, in response to a change in the difference between the reference voltage and the offset-compensated feedback voltage, in controlling the power stage, and
when the reference voltage is less than the offset-compensated feedback voltage, refrain from outputting the boosted bias current.

2. The voltage regulator of claim 1, wherein the power stage includes:
a power transistor having a first conduction terminal coupled to a voltage source, a second conduction terminal coupled to the output of the power stage, and a control terminal; and
a level shifting transistor having a first conduction terminal coupled to a ground node, a second conduction terminal coupled to the control terminal of the power transistor, and a control terminal coupled to the output of the differential stage.

3. The voltage regulator of claim 1, comprising:
a compensation stage coupled to the output of the differential stage and the input of the power stage, and configured to discharge to increase a voltage level at the input of the power stage, and recharge using the output of the differential stage.

4. The voltage regulator of claim 1, comprising:
a bias current stage having a first input for receiving a current representative of an output current of the voltage regulator and an output for providing to the differential stage an adaptive bias current that is proportional to the output current of the voltage regulator.

5. The voltage regulator of claim 4, wherein the bias current stage includes a current source configured to generate a constant current, and wherein the bias current stage is configured to provide, at the output of the bias current stage, the constant current for biasing the differential stage.

6. A voltage regulator, comprising:
a power stage having an input, and an output for providing an output voltage;
a differential amplifier having a first input for receiving a feedback voltage representative of the output voltage, a second input for receiving a reference voltage, a bias current input for receiving a boosted bias current, and an output coupled to the input of the power stage, the differential amplifier being configured to output an error voltage to control the power stage;
an offset voltage source having an input for receiving the feedback voltage and an output for providing an offset-compensated feedback voltage by applying a voltage offset to the feedback voltage; and
a voltage-controlled current source having a first input for receiving the offset-compensated feedback voltage, a second input for receiving the reference voltage, the voltage-controlled current source being operative to:
when the reference voltage is greater than the offset-compensated feedback voltage, output, over an output coupled to the bias current input of the differential amplifier, a boosted bias current proportional to a difference between the reference voltage and the offset-compensated feedback voltage, and bias the differential amplifier based on the boosted bias current, and
when the reference voltage is less than the offset-compensated feedback voltage, refrain from outputting the boosted bias current.

7. The voltage regulator of claim 6, comprising:
a compensation stage including a capacitance and a resistance serially coupled to each other and together coupled between the input of the power stage and a ground node, the capacitance being configured to discharge to compensate the error voltage and recharge based on the boosted bias current.

8. The voltage regulator of claim 6, wherein the voltage-controlled current source is an operational transconductance amplifier, the first input is a non-inverting input, and the second input is an inverting input.

9. The voltage regulator of claim 6, wherein the power stage includes:
a power transistor having a first conduction terminal coupled to a voltage source, a second conduction terminal coupled to the output of the power stage, and a control terminal; and
a level shifting transistor having a first conduction terminal coupled to a ground node, a second conduction terminal coupled to the control terminal of the power transistor, and a control terminal coupled to the input of the power stage.

10. The voltage regulator of claim 9, comprising:
a diode-connected transistor having a first conduction terminal coupled to the voltage source, a second conduction terminal coupled to the second conduction terminal of the level shifting transistor, and a control terminal coupled to the second conduction terminal.

11. The voltage regulator of claim 9, comprising:
a bias current stage having an output coupled to the bias current input of the differential amplifier, and configured to generate a constant bias current and an adaptive bias current, the constant bias current having a constant current level, and the adaptive bias current having a current level that is a function of an output current of the voltage regulator.

12. A method, comprising:
receiving a reference voltage;
receiving a first voltage representative of an output voltage of a voltage regulator;
generating an offset-compensated feedback voltage by applying a voltage offset to the first voltage;
when the reference voltage is greater than the offset-compensated feedback voltage, producing, by a voltage-controlled current source, a boosted bias current proportional to a difference between the reference voltage and the offset-compensated feedback voltage;
biasing a differential amplifier with the boosted bias current to shorten a response time of the differential amplifier in response to changes to the output voltage during load transient conditions; and
when the reference voltage is less than the offset-compensated feedback voltage, refraining, by the voltage-controlled current source, from outputting the boosted bias current.

13. The method of claim 12, comprising:
producing, by the differential amplifier, an error voltage representative of a difference between the output voltage and a desired output voltage of the voltage regulator; and
controlling a power stage of the voltage regulator using the error voltage.

14. The method of claim 12, comprising:
biasing the differential amplifier using a first bias current having a substantially constant current level during operation of the voltage regulator; and
biasing the differential amplifier using a second bias current having a current level that is proportional to an output current of the voltage regulator.

* * * * *